United States Patent
Ishigaki et al.

(10) Patent No.: US 8,652,766 B2
(45) Date of Patent: Feb. 18, 2014

(54) MANUFACTURING METHOD OF DISPLAY DEVICE

(75) Inventors: Toshimasa Ishigaki, Chiba (JP); Fumio Takahashi, Mobara (JP); Toshiki Kaneko, Chiba (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 169 days.

(21) Appl. No.: 13/251,353

(22) Filed: Oct. 3, 2011

(65) Prior Publication Data
US 2012/0082941 A1    Apr. 5, 2012

(30) Foreign Application Priority Data
Oct. 5, 2010    (JP) .................................. 2010-225628

(51) Int. Cl.
*G03F 1/00*    (2012.01)
*G03F 7/00*    (2006.01)

(52) U.S. Cl.
USPC .......................................... 430/320; 430/328

(58) Field of Classification Search
USPC ............... 430/320, 321, 328; 349/114, 129
See application file for complete search history.

(56) References Cited

U.S. PATENT DOCUMENTS

| | | | | |
|---|---|---|---|---|
| 7,553,707 | B2 * | 6/2009 | Horino et al. ................. | 438/149 |
| 7,692,744 | B2 * | 4/2010 | Ishigaki et al. ............... | 349/114 |
| 2008/0088776 | A1 * | 4/2008 | Ishigaki et al. ............... | 349/114 |

FOREIGN PATENT DOCUMENTS

| | | |
|---|---|---|
| JP | 2006-235134 | 9/2006 |
| JP | 2010-26460 | 2/2010 |

* cited by examiner

*Primary Examiner* — Stewart Fraser
(74) *Attorney, Agent, or Firm* — Antonelli, Terry, Stout & Kraus, LLP.

(57) ABSTRACT

An organic passivation film having a high transmittance and capable of setting a taper angle of a through hole within a predetermined range in a liquid crystal display device. A pixel electrode and a source electrode of a TFT are connected by way of a through hole formed in an organic passivation film. The organic passivation film having high productivity, high transmittance, and a predetermined taper angle θ of a through hole can be formed by using a chemical amplification photosensitive resin composition comprising, as a base material, an acrylic resin having a molecular weight of 4,000 to 20,000 and containing 1 to 6 wt % of a photoacid generator as the material for the organic passivation film, performing exposure and development for forming a through hole, and then performing post exposure, prebaking, and baking under appropriate conditions.

11 Claims, 5 Drawing Sheets

FIG. 10

TABLE 1

| RESIN MOLECULAR AMOUNT (WEIGHT AVERAGE) | POST EXPOSURE DOSE (mJ/cm²) | PREBAKING CONDITION | BAKING TEMPERATURE (°C) | TAPER ANGLE (°C) DEVELOPMENT COMPLETED | TAPER ANGLE (°C) AFTER BAKING | JUDGMENT |
|---|---|---|---|---|---|---|
| 3000 | 500 | 100°C/30 min | 230 | 90 | 45 | × |
| 4000 | 300 | NONE | 230 | 90 | 45 | × |
| 4000 | 500 | 90°C/30 min | 230 | 90 | 45 | × |
| 4000 | 300 | 100°C/30 min | 230 | 90 | 50 | ○ |
| 4000 | 500 | 100°C/30 min | 230 | 90 | 50 | ○ |
| 4000 | 1000 | 100°C/30 min | 230 | 90 | 50 | ○ |
| 6000 | 300 | NONE | 230 | 90 | 55 | ○ |
| 6000 | 500 | 100°C/30 min | 230 | 90 | 60 | ○ |
| 10000 | 0 | 100°C/30 min | 230 | 90 | 45 | × |
| 10000 | 300 | NONE | 230 | 90 | 60 | ○ |
| 20000 | 0 | NONE | 230 | 90 | 50 | ○ |
| 20000 | 300 | 150°C/3 min | 230 | 90 | 70 | ○ |
| 20000 | 300 | 180°C/3 min | 230 | 90 | 60 | ○ |
| 30000 | 0 | 150°C/3 min | 230 | 90 | 75 | × |

MANUFACTURING METHOD OF DISPLAY DEVICE

CLAIM OF PRIORITY

The present application claims priority from Japanese Patent Application JP 2010-225628 filed on Oct. 5, 2010, the content of which is hereby incorporated by reference into this application.

BACKGROUND OF THE INVENTION

1. Field of the Invention

The present invention relates to a manufacturing method of a display device, particularly, a liquid crystal display device. The invention relates to a manufacturing method of a display device, particularly, a liquid crystal display device having high reliability and satisfactory productivity.

2. Description of the Related Art

A liquid crystal display device includes a TFT substrate having pixel electrodes, thin film transistors (TFT), etc. formed thereon in a matrix form, and a counter electrode opposing the TFT substrate and having color filters, etc. formed at positions corresponding to the pixel electrodes of the TFT substrate. Liquid crystals are put between the TFT substrate and the counter substrate. The liquid crystal display device controls light transmittance for each pixel by using liquid crystal molecules to form images.

Since a TFT substrate includes scanning lines, video signal lines, TFTs, etc. formed thereon, the surface of the TFT substrate is uneven. Unevenness of the surface of the TFT substrate will bring about variations in thickness of a liquid crystal layer put between the TFT substrate and the counter substrate and thus light leakage will occur at some places, resulting in decrease in contrast of the screen.

To prevent such a drawback, about 2 μm-organic passivation film is formed over the TFT, etc. to planarize the boundary to the liquid crystals and pixel electrodes, etc. are formed thereon. To connect the pixel electrode to the source of the TFT the organic passivation film needs to be formed with a through hole. Using a photosensitive resin for the organic passivation film allows for direct exposure to the resin and development without using a resist. Thus the process can be simplified.

A method of forming the organic passivation film using such a photosensitive resin includes a technique as disclosed in JP-A-2010-26460. This patent document describes a method of forming an organic film by using a positive photosensitive composition. Further, JP-A-2006-235134 describes a method of forming through holes different in taper angle by one shot photolithography using a photomask having a phase shift effect.

SUMMARY OF THE INVENTION

Organic insulating film resists conventionally used (organic passivation film materials) is prepared by adding photosensitive naphtoquinone diazide (hereinafter referred to as NQD) to acrylic resins but such materials have extremely low sensitivity and involve a problem with productivity.

In recent years, steppers for exposure effective in terms of resolution or alignment accuracy have been used more and more along with increase in fineness of pixels. Since existent organic passivation film materials require an exposure dose three to six that of usual photoresists, the productivity is lowered significantly when they are used in combination with the steppers originally having a drawback in view of the productivity.

The low sensitivity of the existent organic passivation film materials is attributable to that the coating film thickness of a pattern fabrication positive resist of an identical photosystem (photosensitizer NQD·Novolac type resin) is about 1.5 μm, whereas the organic passivation film which is left on the substrate for the use of insulation and planarization requires a coating film thickness of 2 to 3 μm.

While the photosensitizer NQD is incorporated by 20 to 30% on the resin, NQD has a strong absorption at a short wavelength and the transparency of the coating film is poor. Light is therefore not easy to reach the underlying boundary as the coating film thickness increases and, accordingly, the exposure dose has to be increased.

When NQD is exposed to a light, some hydrophobic groups of NQD are transformed into a highly hydrophilic acid group (—COOH) to result in development solubility. Since, in the NQD type photoresist, the resin per se does not change at all and exposure contrast is obtained only by the optical change of NQD, it is necessary to add a great amount of NQD.

Since a usual positive resist is such that the resist is removed after pattern fabrication, transparency is not required for the resist film. In contrast, since the insulating organic film resist is left on the TFT, a film transparency is necessary. Accordingly, a highly transparent acrylic material is used for the resin.

Further, to increase the durability as a permanent film, a heat curing system is introduced for the resin. The heat curing temperature is usually 200 to 230° C. and NQD is colored when the developed film of the organic passivation film material is heated as it is. Then, coloration of NQD is prevented by the application of a light radiation step called as post exposure after the development.

While it is necessary to irradiate the film material with light of 400 nm or less by 500 mJ/cm$^2$ or more in order to prevent lowering of the transmittance, there is a problem that the film transmittance is lower by 2 to 10% as compared with the acrylic resin alone even when light is irradiated sufficiently.

It is necessary to form a through hole in the organic passivation film. When the taper angle of the through hole is excessively small, the transmittance in the pixel is lowered. By contrast, when the taper angle of the through hole is excessively large, this results in a problem with disconnection at the pixel electrode in the through hole.

The present invention intends to attain a manufacturing method of a liquid crystal device in which it takes short time for forming an organic passivation film and lowering of light transmittance of the organic passivation film is small, the liquid crystal device enabling a through hole to be formed in the organic passivation film at an appropriate taper angle (1) The present invention provides, in a first aspect, a manufacturing method of a display device of forming an organic passivation film by a process comprising the steps of:

coating a chemical amplification photosensitive resin composition comprising an acrylic resin having a molecular weight of 4,000 to 20,000 as a base material, and containing 1 to 4 wt % of a photoacid generator (hereinafter simply referred to as PAG), and prebaking to cure the coated composition;

exposing the cured chemical amplification photosensitive resin composition by using a mask and developing the same;

subjecting the developed chemical amplification photosensitive resin composition to post exposure at an exposure dose of 500 mJ/cm$^2$ or less; and, subsequently, heating the exposed composition at 220 to 250° C.

(2) In a preferred embodiment, the chemical amplification photosensitive resin composition contains 1 to 2 wt % of PAG.

(3) The present invention provides, in a second aspect, a manufacturing method of a display device of forming an organic passivation film by a process comprising the steps of:

coating a chemical amplification photosensitive resin composition comprising an acrylic resin having a molecular weight of 4,000 to 20,000 as a base material, and containing 1 to 5 wt % of a PAG, and prebaking to cure the coated composition;

exposing the cured chemical amplification photosensitive resin composition by using a mask and developing the same;

subjecting the developed chemical amplification photosensitive resin composition to post exposure at an exposure dose of 200 mJ/cm$^2$ or less; and, subsequently, heating the exposed composition at 220 to 250° C.

The present invention provides, in a third aspect, a manufacturing method of a display device of forming an organic passivation film by a process comprising the steps of:

coating a chemical amplification photosensitive resin composition comprising an acrylic resin having a molecular weight of 4,000 to 20,000 as a base material and containing 1 to 6 wt % of PAG, and prebaking to cure the coated composition;

exposing the cured chemical amplification photosensitive resin composition by using a mask and developing the same; and subjecting the developed chemical amplification photosensitive resin composition to post exposure at an exposure dose of 300 mJ/cm$^2$ to 500 mJ/cm$^2$ or less;

subsequently, performing prebaking at a prebaking temperature of 100° C. to 180° C.; and subsequently heating the prebaked composition at 220 to 250° C.

According to the invention, since the step time for forming the organic passivation film can be shortened, the productivity of the liquid crystal display device can be improved. Further, according to the invention, since the lowering of the light transmittance of the organic passivation film can be suppressed, the brightness of the screen can be increased.

Further, according to the invention, since the taper angle of the through hole in the organic passivation film can be formed to an appropriate value, a display device, particularly, a liquid crystal display device of high reliability can be attained.

BRIEF DESCRIPTION OF THE DRAWINGS

FIG. 10 is a table showing a relation between the conditions for forming an organic passivation film and a taper angle θ of a through hole.

DESCRIPTION OF THE PREFERRED EMBODIMENTS

In the present invention, materials of chemical amplification system are used as an organic passivation film material. The chemical amplification system is a system such that, when a film is exposed to a light, PAG is decomposed to generate an acid, highly hydrophobic protecting group of the resin is decapped by the action of the acid and replaced with a highly hydrophilic acid group or hydroxyl group, to thereby achieve solubility in development.

While the chemical amplification PAG is colored in the same manner as NQD, since the acid acts as a catalyst, the addition amount of PAG may be 1/10 or less of NQD. The coating film therefore has high transparency and transmits light well during exposure, and a high sensitivity can be obtained. Further, different from NQD, the chemical amplification PAG scarcely suffers from coloration when heated without light irradiation. Thus, post exposure can be omitted and transmittance of an obtained film is high.

The chemical amplification system is a technique used for increasing the integration degree of semiconductors, and has been considered that application of the technique to liquid crystal display panels is difficult. One of the reasons is that, different from the NQD resist, an abrupt taper, or inverse taper is formed at the pattern edge after the development.

In semiconductors, the abrupt taper contributes to the refinement of pattern. However, if the taper angle of through hole in the liquid crystal display device is abrupt, step disconnection is caused in the pixel electrode, and connection failure between the source electrode of the TFT and the pixel electrode is resulted.

The present invention enables a chemical amplification material to be applied to a display device, particularly, a liquid crystal display device. The present invention is to be described in detail by way of examples. Although the examples described below take a so-called IPS (In Plane Switching) liquid crystal display device as an instance, the invention is not always restricted to the IPS liquid crystal display device, and can also be applied to other display devices using organic passivation films, particularly, liquid crystal display devices.

Example 1

Figure 1:
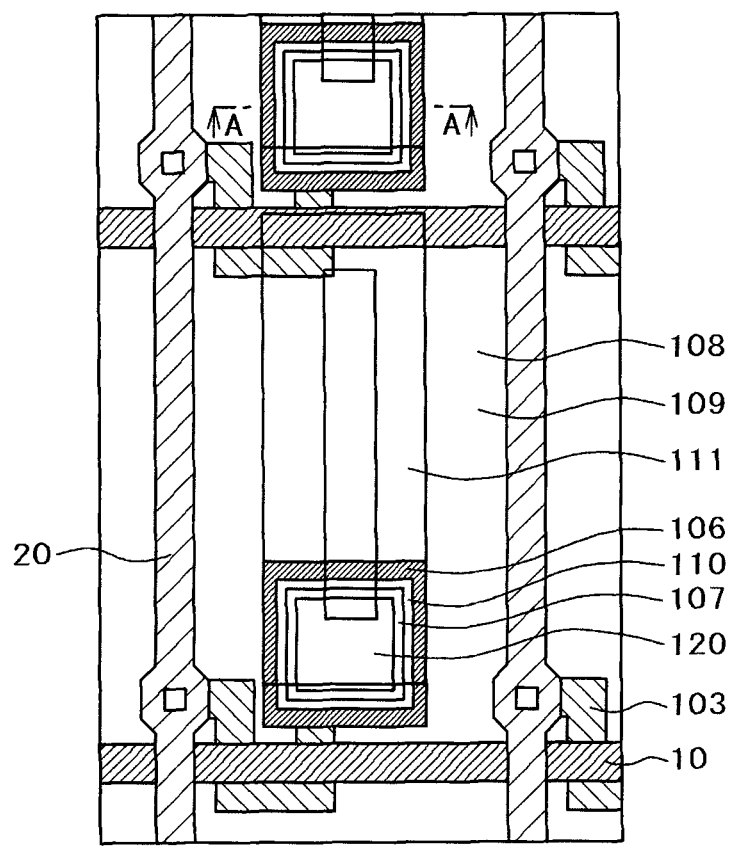
FIG. 1 is a plan view of a pixel in an IPS liquid crystal device.

FIG. 1 is a plan view for a pixel portion of an IPS liquid crystal display device. In FIG. 1, signal lines 10 extend in the lateral direction, and video signal lines 20 extend in the longitudinal direction, being put an interlayer insulating film between them. A region surrounded by the scanning line 10 and the video signal 20 defines a pixel. A TFT, a pixel electrode 111, a counter electrode 109, etc. are formed in the pixel.

In FIG. 1, a semiconductor layer 103 is bent in a turned square U-shaped configuration and the scanning line 10 traverses the semiconductor layer 103 with a gate insulating film 104 being sandwiched between them. The scanning line 10 also serves as a gate electrode. A portion where the scanning line 10 and the semiconductor layer 103 intersect defines a channel of the TFT. One end of the semiconductor layer 103 is connected to the video signal line 20 and the video signal line 20 also serves as a drain electrode. The other end of the semiconductor layer 103 is connected with a source electrode 106. Accordingly, two channels are formed serially between the drain electrode and the source electrode 106.

In FIG. 1, the pixel electrode 111 and the source electrode 106 of the TFT are connected via a through hole 120 formed in the inorganic passivation film 107 and a second interlayer insulating film 110. The pixel electrode 111 is a belt-like electrode of which both ends being closed. A counter electrode 109 is formed as a solid plane over the organic passivation layer 108. The second interlayer insulating film 110 is formed between the counter electrode 109 and the pixel electrode 111. When a video signal is applied to the pixel electrode 111, liquid crystal molecules are rotated by the lines of electric force generated between the pixel electrode 111 and the counter electrode 109 to control a light that transmits the liquid crystals.

Figure 2:
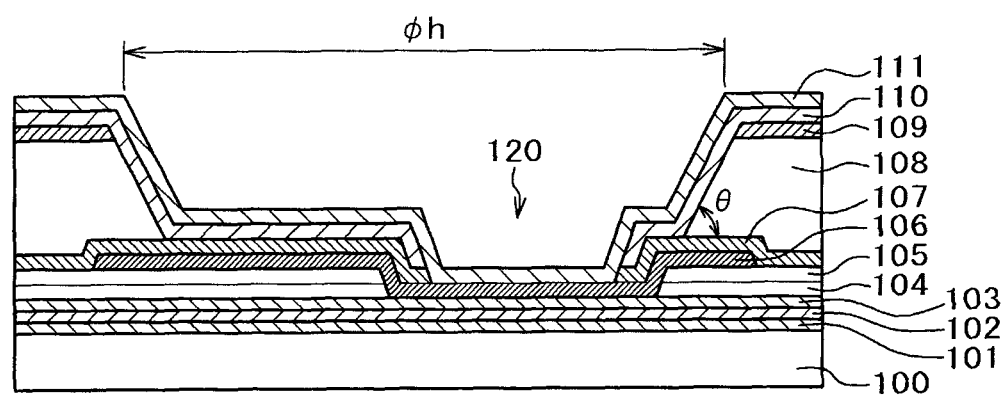
FIG. 2 is a cross-sectional view along line A-A in FIG. 1.

FIG. 2 is a cross sectional view along line A-A in FIG. 1, that is a cross sectional view for a portion of the through hole 120. In FIG. 2, a first underlayer film 101 and a second underlayer film 102 are formed over a TFT substrate 100 formed of glass. The first underlayer film 101 and the second underlayer film 102 prevent impurities in the glass substrate from precipitating to contaminate the semiconductor layer 103.

A semiconductor film is formed over the second underlayer film 102. The semiconductor film is formed contiguously with the TFT shown in FIG. 1 to form a source of the TFT. A gate insulating film 104 is formed over the semiconductor film. In the TFT not illustrated in FIG. 2, a gate electrode is formed over the gate insulating film 104. In FIG. 1, the scanning line 10 serves also as the gate electrode.

A first interlayer insulating film 105 for insulating the scanning line 10 and the video signal line 20 is formed over the gate insulating film 104. The source electrode 106 and the source of the TFT comprising the semiconductor are connected via a through hole formed in the gate insulating film 104 and the first interlayer insulating film 105. An inorganic passivation film 107 is formed over the source electrode 106. The inorganic passivation film 107 protects a TFT not illustrated.

An organic passivation film 108 is formed over the inorganic passivation film 107. The organic passivation film 108 serves to protect the TFT with the inorganic passivation film 107, and also serves as a planarizing film. Accordingly, the organic passivation film 108 is formed as thick as about 2 to 3 μm. Then, the through hole 120 is formed in the organic passivation film 108.

A taper angle θ of the through hole 120 gives a significant effect on the connect between the source electrode 106 and the pixel electrode 111 to be formed subsequently. In addition, if the taper angle θ of the through hole 120 in the organic passivation film 108 is excessively small, the upper diameter φh of the through hole is increased, and the effective area of a pixel is therefore decreased to lower the transmittance of the pixel.

A counter electrode 109 is formed by a transparent conductive film ITO (Indium Tin Oxide) over the organic passivation film 108. The counter electrode 109 is formed as a solid plane, in a manner that dodges the through hole 120. A second interlayer insulating film 110 is formed over the counter electrode 109.

Then, the second interlayer insulating film 110 and the inorganic passivation film 107 are etched to form the through hole 120. ITO is subsequently deposited and patterned to form a pixel electrode 111.

The taper angle θ of the through hole 120 formed in the organic passivation film 108, shown in FIG. 2, is important for the characteristics of a liquid crystal display panel. That is, when the taper angle θ is excessively small, the diameter φh of the through hole 120 increases. Since the portion where the through hole 120 is formed cannot be used as the display region, the transmittance of the pixel is lowered and thus the brightness of the screen is decreased. On the other hand, when the diameter φh of the through hole 120 is excessively small, step disconnection of the pixel electrode 111 is caused to result in connection failure.

For preventing these problems, it is necessary that the taper angle is controlled within a range of 60±10 degree. This control for the taper angle θ is to be described in detail later.

Figure 3:
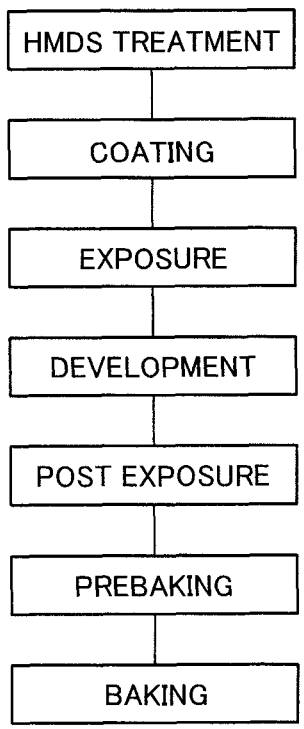
FIG. 3 shows a process for forming an organic passivation film.

FIG. 3 is a process flow for forming an organic passivation film. The organic passivation film 108 is formed over the inorganic passivation film 107 and, in order to improve the adhesion between the inorganic passivation film 107 and the organic passivation film 108, HDMS (hexamethylsilazane) treatment is performed to the inorganic passivation film 107.

Then, the material for the organic passivation film 108 is coated by spin coating, slit coating, etc. over the inorganic passivation film 107. The substrate having the material for the organic passivation film 108 coated thereover is prebaked by being placed on a hot plate heated to 80 to 110° C. for 1 to 3 minutes, to thereby evaporate the solvent for curing.

After that, to form the through hole 120 in the organic passivation film 108, exposure is performed. As an exposure light source, a UV light from a super high pressure mercury lamp is used, and the exposure wavelengths are those of ghi lines. Development is then performed by a 0.2 to 0.5% aqueous solution of TMAH (tetramethyl ammonium hydride). While TMAH has a feature of not leaving residues, the development is not limited to the use of TMAH, and the development may be conducted using general aqueous alkali solutions.

Positive materials such as the material described above, are developed by using a method called puddle development, which is such that supplies a developer on a substrate and keep it still for a predetermined time. A shower development can also be applied, although the required amount of the developer used increases. After flashing the developer by rinsing with purified water, the substrate is dried by an air knife or spinning.

Then, post exposure is performed. In the existent NQD material, post exposure step is essential for improving the transparency of the insulating film. However, in the chemical amplification type material of the invention, the post exposure is optional and not essential. Prebaking is then performed to adjust the taper angle θ of the through hole 120. Details of the prebaking are described later. As a final step, baking for heat curing in an oven at 220 to 250° C., for 30 minutes to one hour, and thus an insulating film is completed.

The relation between the process conditions and the transmittance, the sensitivity of the material, and the taper angle θ of the organic passivation film 108 is to be described under the condition that the chemical amplification material of the invention and the existent NQD material are used.

The base material for the chemical amplification organic passivation film 108 used in this example is an acrylic resin comprising acetal protection group-containing methacrylate ester and an epoxy group-containing methacrylate ester in the molecule, which contains a sulfonic acid chemical amplification PAG as a photosensitive material. The material for the NQD organic passivation film 108 used for comparison is an acrylic resin comprising methacrylate and epoxy group-containing methacrylate ester in the molecule which contains NQD as a photosensitive material.

Figure 4:
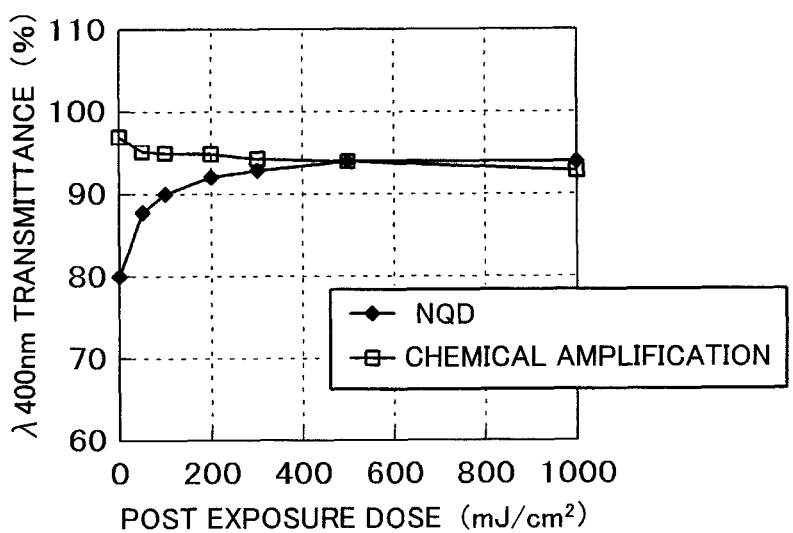
FIG. 4 is a graph showing a relation between the transmittance of an organic passivation film and a post exposure dose.

FIG. 4 is a graph showing a relation between the post exposure dose and the transmittance of the chemical amplification material containing 2 wt % of PAG and the NQD material containing 25 wt % of NQD, that is an existent example.

In FIG. 4, the abscissa represents the post exposure dose and the ordinate represents the transmittance when a film thickness is 2 μm. Transmittance (ordinate) is evaluated using UV light with 400 nm wavelength. This is because yellow coloration can be observed most easily upon evaluation in such condition. Post exposure was performed to the coating film while changing the exposure dose, and the transmittance of the film, after baking at a temperature of 230° C. for 30 minutes, was measured by a spectrophotometer.

In the NQD material that is the existent material, post exposure of 500 mJ/cm$^2$ or more was necessary to prevent lowering of the transmittance 1. Meanwhile, in the chemical amplification material, transmittance was highest when post exposure was not conducted, and the transmittance was lower than that of the existent material when the post exposure dose is 500 mJ/cm$^2$ or more. That is to say that, in the chemical amplification material, the post exposure can be omitted, or if the post exposure is performed, the exposure dose can be decreased. The productivity can therefore be improved.

Figure 5:
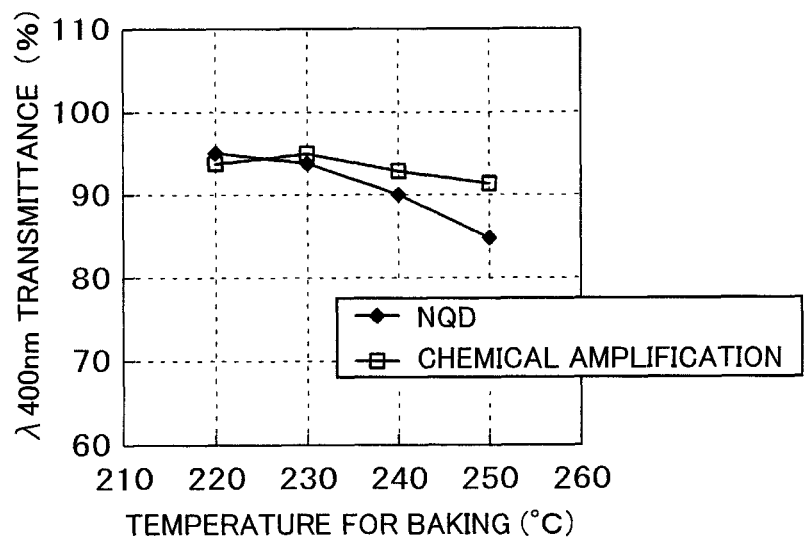
FIG. 5 is a graph showing a relation between the transmittance of the organic passivation film and a baking temperature.

FIG. 5 is a graph showing a relation between the baking temperature and the transmittance for the chemical amplification material containing 2 wt % of PAG and for the NQD material containing 25 wt % of NQD, that is an extent example.

In FIG. 5, the abscissa represents the baking temperature and the ordinate represents the transmittance of a UV light with a wavelength of 400 nm, when the film thickness is 2 μm. The post exposure dose was set as 500 mJ/cm$^2$ in the existent NQD material, and 200 mJ/cm$^2$ in the chemical amplification material. They were baked in an oven for 30 minutes respectively to prepare organic passivation films 108. The transmittance was then measured by a spectrophotometer.

In the existent material, the transmittance is lowered greatly when the baking temperature exceeds 230° C. In contrast, in the chemical amplification material, the transmittance is maintained over the target transmittance, 90% or more even at 250° C.

Baking also serves as aging for the subsequent step. Therefore, if the baking temperature for the organic passivation layer 108 can be raised, the processing temperature of processes performed after the formation of the organic passivation film 108, such as ITO deposition, formation of the interlayer insulating film by CVD, baking of an alignment film, etc. can also be raised. Consequently, the quality of products can be improved.

Figure 6:
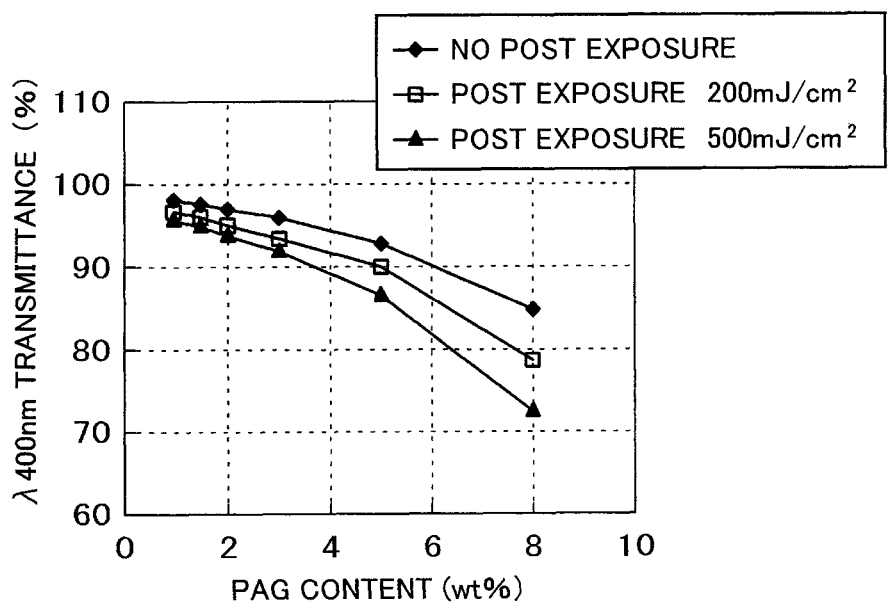
FIG. 6 is a graph showing a relation between the transmittance and the PAG content of the organic passivation film.

FIG. 6 is a graph showing the change of the transmittance when the PAG content is changed using the post exposure dose as a parameter. In FIG. 6, the abscissa represents the PAG content (wt %) in the chemical amplification material and the ordinate represents the transmittance of a UV light with a wavelength of 400 nm, when the thickness of film is 2 μm.

Figure 7:
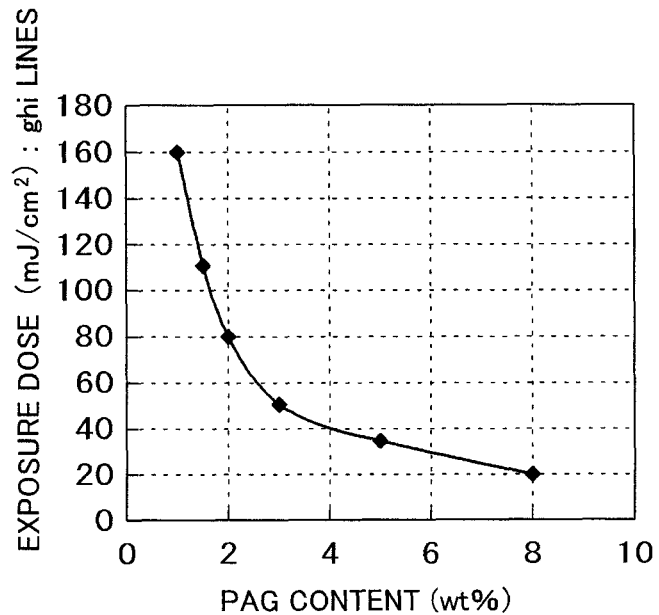
FIG. 7 is a graph showing a relation between the exposure dose and the PAG content of the organic passivation film.

In FIG. 6, when the PAG content is increased, as shown in FIG. 7 described later, while the sensitivity is improved, the film transmittance is lowered. Further, in the chemical amplification material, when the post exposure dose is increased, the film transmittance is lowered.

The PAG content capable of obtaining the aimed transmittance, 90% or more was: 6 wt % or less when the post exposure was not conducted, 5 wt % when the post exposure dose was 200 mJ/cm$^2$, and 4 wt % or less when the post exposure dose was 500 mJ/cm$^2$. The PAG content is 1 wt % or more in practical use.

According to FIG. 6, lower PAG content is more desirable regarding the transmittance. FIG. 7 shows a relation between the PAG content (wt %) and the exposure dose (mJ/cm$^2$). In FIG. 7, the abscissa represents wt % of the PAG content and the ordinate represents the exposure dose (mJ/cm$^2$) when ghi line is used. The sensitivity is higher when the exposure dose is smaller. Referring to FIG. 7, when the PAG content is suppressed to 1.5 wt % giving preference to the transmittance, a required exposure dose is 110 mJ/cm$^2$.

On the other hand, in the existent NQD material, the exposure dose is more than 150 mJ/cm$^2$ even in a material of high sensitivity specification. Accordingly, in the chemical amplification material, even when the PAG content is lowered in order to improve the transmittance, higher sensitivity can be maintained compared with the existent NQD material.

Other important characteristics of the organic passivation film 108 is a shape of the through hole. The aperture ratio is lowered when the taper angle θ of the through hole 120 is excessively small. On the other hand, connection failure of the pixel electrode 111 occurs when the taper angle is excessively large. Accordingly, it is necessary that the taper angle θ of the through hole 120 is controlled to about 60±10 degree.

Figure 8:
FIG. 8 is a cross sectional view, after development, of a through hole formed in a film using a chemical amplification material.
Figure 9:
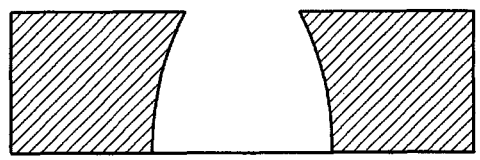
FIG. 9 is a cross sectional view, after development, of another through hole formed in a film using a chemical amplification material.

The control for the taper angle θ is the most important problem for the chemical amplification material. Since the chemical amplification material transmits light well, a taper after development is formed at a right angle as shown in FIG. 8, or formed inversely as shown in FIG. 9. The reason inversed taper occurs is because the acid generated at the surface tends to be deactivated by the effect of oxygen or an alkali in an atmosphere, and the development solubility at the surface is therefore lowered.

Table 1 in FIG. 10 shows the result of examining the taper angle θ of the through hole 120 in the organic passivation film material with 2 wt % PAG content while changing the molecular weight of a base material, post exposure dose, and baking condition. In Table 1, conditions were judged as "○" where the taper angle was within a range of 50 to 70 degree and as "×" where the conditions were not within the range.

The resin molecular weight, the post exposure dose, and the prebaking condition were used as parameters. Baking (ordinary baking) temperature was constant at 230° C. The taper angle θ after development and the taper angle θ after the baking were evaluated. The taper angle θ after the development was 90 degree in each case.

In Table 1, regarding the molecular weight of the base material, the taper angle θ can be within a range from 50 to 70 degree when the range of the molecular weight is from 4,000 to 20,000. Generally, the taper angle θ becomes larger as the molecular weight becomes greater. When the molecular weight was less than 4,000, the taper angle could not be increased even process control is applied. On the other hand, when the molecular weight exceeded 20,000, the taper angle could not be decreased even the process control is applied.

The taper angle θ becomes larger as the post exposure dose becomes larger. However, even when the post exposure dose is 500 mJ/cm$^2$ or less, the taper angle θ can be set within the aimed range if other conditions are satisfied. Further, in Table 1, in the case the post exposure dose is 1,000 mJ/cm$^2$, while the taper angle θ can be set to 50 degree by properly selecting the molecular weight of the base material and the prebaking condition, the transmittance of the organic passivation film 108 is lowered.

Generally, the taper angle θ is decreased by fluidization of the film in the baking. Baking may be performed directly after the post exposure, but the control for the taper angle θ becomes difficult. When prebaking is performed before the baking, the taper angle θ can be controlled more easily.

The prebaking condition was evaluated by changing the prebaking temperature while setting the prebaking time constant as 30 minutes. When the prebaking temperature is lower than the glass transition point of the material, it maintains the taper angle after the development, and when the temperature is at a glass transition point or higher, the taper angle is decreased. The glass transition point of the acrylic resin is 110 to 130° C.

According to an experiment conducted independently of that in Table 1, at a prebaking temperature of 100 to 110° C., the taper angle θ after the prebaking step was maintained also after the baking. However, at a prebaking temperature of lower than the 100° C., it had no effect on the lowering of the taper angle θ in the baking. That is to say that the effect of the prebaking step was not obtained at a temperature lower than 100° C.

When the prebaking temperature was set at 130 to 150° C., the taper angle θ could be decreased in the prebaking step. However, in a range where the prebaking temperature exceeded 150° C., the change of taper angle θ was substantially constant in the prebaking step.

In Table 1, when the resin molecular weight was 3,000, the taper angle could not be made to larger than 50 degree even when setting the post exposure dose to 500 mJ/cm$^2$ and the prebaking temperature to 100° C.

Further, at the resin molecular weight of 4,000, the taper angle θ cannot be made 50 degree or larger even when the post exposure dose is defined to 300 mJ/cm$^2$ or 500 mJ/cm$^2$, and where prebaking is not performed or prebaking is performed at 90° C., that is, lower than 100° C.

Further, at the resin molecular weight of 10,000, if the post exposure is not performed, the taper angle cannot be set to 50 degree or larger even when the prebaking temperature is set at 100° C.

On the other hand, when the resin molecular weight is 10,000 and the post exposure dose is 300 mJ/cm$^2$, the taper angle θ can be set to 60 degree even if the prebaking is not performed. Further, referring to Table 1, even when the prebaking is not performed, the taper angle θ can be set within a defined range when the resin molecular weight is 6,000 or more and the post exposure dose is 300 mJ/cm$^2$.

While the temperature of the baking in Table 1 is 230° C., an identical result was obtained also at 220° C. to 250° C. Further, although the PAG content in Table 1 is 2 wt %, an identical result was also obtained about the taper angle θ of the through hole 120 for the PAG content of 1 to 6 wt %.

Table 1 focuses on the result of evaluation of the taper angle θ formed to the organic passivation film 108. However, optimal process conditions can also be obtained by evaluating the transmittance and the photosensitive characteristics of the organic passivation film 108.

What is claimed is:

1. A method of manufacturing a display device, wherein an organic passivation film is formed, the method comprising the steps of:
    coating a chemical amplification photosensitive resin composition comprising an acrylic resin having a molecular weight of 4,000 to 20,000 as a base material, the chemical amplification photosensitive resin composition containing 1 to 4 wt % of a photoacid generator, and prebaking the chemical amplification photosensitive resin composition to cure the coated composition;
    exposing the cured chemical amplification photosensitive resin composition by using a mask and developing the same;
    subjecting the developed chemical amplification photosensitive resin composition to post exposure at an exposure dose of 500 mJ/cm$^2$ or less; and
    subsequently, heating the post-exposed composition at 220 to 250° C.

2. A method of manufacturing a display device according to claim 1, wherein the chemical amplification photosensitive resin composition contains 1 to 2 wt % of the photoacid generator.

3. A method of manufacturing a display device, wherein an organic passivation film is formed, the method comprising the steps of:
    coating a chemical amplification photosensitive resin composition comprising an acrylic resin having a molecular weight of 4,000 to 20,000 as a base material, the chemical amplification photosensitive resin composition containing 1 to 5 wt % of a photoacid generator, and prebaking the chemical amplification photosensitive resin composition to cure the coated composition;
    exposing the cured chemical amplification photosensitive resin composition by using a mask and developing the same;
    subjecting the developed chemical amplification photosensitive resin composition to post exposure at an exposure dose of 200 mJ/cm$^2$ or less; and
    subsequently, heating the post-exposed composition at 220 to 250° C.

4. A method of manufacturing a display device, wherein an organic passivation film is formed, the method comprising the steps of:
    coating a chemical amplification photosensitive resin composition comprising an acrylic resin having a molecular weight of 4,000 to 20,000 as a base material, the chemical amplification photosensitive resin composition containing 1 to 6 wt % of a photoacid generator, and prebaking the chemical amplification photosensitive resin composition to cure the coated composition;
    exposing the cured chemical amplification photosensitive resin composition by using a mask and developing the same;
    subjecting the developed chemical amplification photosensitive resin composition to post exposure at an exposure dose of 300 mJ/cm$^2$ to 500 mJ/cm$^2$;
    subsequently performing prebaking at a prebaking temperature of 100° C. to 180° C.; and
    subsequently heating the prebaked composition at 220 to 250° C.

5. A method of manufacturing a display device according to claim 1, wherein
    a through hole is formed in the organic passivation film,
    the organic passivation film has a side wall of the through hole, and
    an angle formed between the side wall and a film in a layer below the organic passivation film is 50 degree or more and 70 degree or less.

6. A method of manufacturing a display device according to claim 2, wherein
    a through hole is formed in the organic passivation film,
    the organic passivation film has a side wall of the through hole, and an angle formed between the side wall and a film in a layer below the organic passivation film is 50 degree or more and 70 degree or less.

7. A method of manufacturing a display device according to claim 3, wherein a through hole is formed in the organic passivation film, the organic passivation film has a side wall of the through hole, and an angle formed between the side wall and a film in a layer below the organic passivation film is 50 degree or more and 70 degree or less.

8. A method of manufacturing a display device according to claim 4, wherein a through hole is formed in the organic passivation film, the organic passivation film has a side wall of the through hole, and an angle formed between the side wall and a film in a layer below the organic passivation film is 50 degree or more and 70 degree or less.

9. A method of manufacturing a display device according to claim 1, wherein the organic passivation film is formed to have a thickness of 2 to 3 μm.

10. A method of manufacturing a display device according to claim 3, wherein the organic passivation film is formed to have a thickness of 2 to 3 μm.

11. A method of manufacturing a display device according to claim 4, wherein the organic passivation film is formed to have a thickness of 2 to 3 μm.

* * * * *